(12) United States Patent
Binboga

(10) Patent No.: US 7,630,250 B2
(45) Date of Patent: Dec. 8, 2009

(54) CONTROLLED RAMP RATES FOR METAL BITLINES DURING WRITE OPERATIONS FROM HIGH VOLTAGE DRIVER FOR MEMORY APPLICATIONS

(75) Inventor: Evrim Binboga, Sunnyvale, CA (US)

(73) Assignee: Spansion LLC, Sunnyvale, CA (US)

(*) Notice: Subject to any disclaimer, the term of this patent is extended or adjusted under 35 U.S.C. 154(b) by 254 days.

(21) Appl. No.: 11/872,989

(22) Filed: Oct. 16, 2007

(65) Prior Publication Data

US 2009/0097312 A1    Apr. 16, 2009

(51) Int. Cl.
 *G11C 11/34* (2006.01)
(52) U.S. Cl. ............................ 365/185.19; 365/185.03; 365/185.18; 365/185.23
(58) Field of Classification Search ............. 365/185.19, 365/185.03, 185.18, 185.23
See application file for complete search history.

(56) References Cited

U.S. PATENT DOCUMENTS

| 5,128,895 | A |  | 7/1992 | Park |
|---|---|---|---|---|
| 5,408,133 | A |  | 4/1995 | Honnigford et al. |
| 5,872,733 | A |  | 2/1999 | Buti et al. |
| 6,172,917 | B1 | * | 1/2001 | Kataoka et al. ........ 365/189.05 |
| 6,934,190 | B1 | * | 8/2005 | Liu et al. ............... 365/185.19 |
| 7,307,878 | B1 | * | 12/2007 | Lee et al. ............... 365/185.03 |
| 2006/0087886 | A1 | * | 4/2006 | Cho et al. .............. 365/185.18 |
| 2006/0133149 | A1 |  | 6/2006 | Chae et al. |

OTHER PUBLICATIONS

International Search Report for Application # PCT/US2008/079993 dated Jan. 22, 2009.

* cited by examiner

*Primary Examiner*—Pho M Luu
*Assistant Examiner*—Toan Le
(74) *Attorney, Agent, or Firm*—Eschweiler & Associates, LLC

(57) ABSTRACT

Systems and methods that control the switching transition times or profile of a ramped voltage write signal used for programming or erasing at least a wordline of an array of multi-bit and/or multi-level flash memory cells are provided. In one embodiment, this goal is accomplished by applying a ramped or otherwise controlled profile write voltage to the flash memory cells in order to avoid disturb issues to the unselected (non-targeted) neighboring memory cells, which preserves the existing state of the neighboring cells while keeping the design as compact and manageable as possible yet maintains a high write speed. The systems and method are applicable to, and reliable for various memory technologies, since the size of the steps or other such functional transitions of the ramped voltage profile can be adjusted or trimmed to any level of resolution required.

25 Claims, 9 Drawing Sheets

CONTROLLED RAMP RATES FOR METAL BITLINES DURING WRITE OPERATIONS FROM HIGH VOLTAGE DRIVER FOR MEMORY APPLICATIONS

FIELD OF INVENTION

The present invention relates generally to memory devices and the like, and in particular, to a system and method of controlling write operations for multi-bit flash memory devices.

BACKGROUND OF THE INVENTION

Many different types and styles of memory exist to store data for computers and similar type systems. For example, random access memory (RAM), dynamic random access memory (DRAM), static random access memory (SRAM), read only memory (ROM), programmable read only memory (PROM), electrically programmable read only memory (EPROM), electrically erasable programmable read only memory (EEPROM) and flash memory are all presently available to accommodate data storage.

Each type of memory has its own particular advantages and disadvantages. For example, DRAM and SRAM allow individual-bits of data to be erased one at a time, but such memory loses its data when power is removed. EEPROM can alternatively be easily erased without extra exterior equipment, but has reduced data storage density, lower speed, and higher cost. EPROM, in contrast, is less expensive and has greater density but lacks ease of erasability.

Flash memory, has become a popular type of memory because it combines the advantages of the high density and low cost of EPROM with the electrical erasability of EEPROM. Flash memory can be rewritten and can hold its contents without power, and thus is nonvolatile. It is used in many portable electronic products, such as cell, phones, portable computers, voice recorders, etc. as well as in many larger electronic systems, such as cars, planes, industrial control systems, etc.

Flash memory is generally constructed of many memory cells where, generally, single bits of data are stored in and read from respective memory cells. The cells are generally programmed by hot electron injection and erased by Fowler-Nordheim tunneling or other mechanisms. As with many aspects of the semiconductor industry, there is a continuing desire and effort to achieve higher device packing densities and increase the number of memory cells on a semiconductor wafer. Similarly, increased device speed and performance are also desired to allow more data to be stored on smaller memory devices.

Individual flash memory cells are organized into individually addressable units or groups, which are accessed for read, program, or erase operations through address decoding circuitry. The individual memory cells are typically comprised of a semiconductor structure adapted for storing a bit of data and includes appropriate decoding and group selection circuitry, as well as circuitry to provide voltages to the cells being operated upon.

The erase, program, and read operations are commonly performed by application of appropriate voltages to certain terminals of the memory cell. In an erase or write operation the voltages are applied so as to cause a charge to be removed or stored in the memory cell. In a read operation, appropriate voltages are applied so as to cause a current to flow in the cell, wherein the amount of such current is indicative of the value of the data stored in the cell. The memory device includes appropriate circuitry to sense the resulting cell current in order to determine the data stored therein, which is then provided to data bus terminals of the device for access by other devices in a system in which the memory device is employed.

Programming circuitry controls a bit of a cell by applying a signal to a wordline, which acts as a control gate, and changing bitline connections such that the bit is stored by the source and drain connections. Programming a cell using a suitable mechanism such as hot electron injection, generally increases the threshold voltage of a cell. In operation, individual flash cells are addressed via the respective bitline and wordline using a peripheral decoder and control circuitry for programming or erasing (writing), or reading functions. Erasing is performed as a blanket operation wherein an array or sector of cells can be simultaneously erased and typically produces a lower threshold voltage in the cell.

By way of further detail, a single bit flash memory cell may be programmed by a suitable mechanism, such as hot electron injection. Programming with hot-electron injection involves applying a relatively high voltage to the control gate and connecting the source to ground and the drain to a predetermined potential above the source. When a resulting electric field is high enough, electrons collect enough energy to be injected from the source onto the nitride layer of the ONO flash. As a result of the trapped electrons, the threshold voltage of the cell increases. This change in the threshold voltage (and thereby the channel conductance) of the cell created by the trapped electrons is what causes the cell to be programmed.

As with many aspects of the semiconductor: industry, there is a continuing desire to scale down device dimensions to achieve higher device packing densities on semiconductor wafers. Similarly, increased device speed and performance are also desired to allow more data to be stored on smaller memory devices. Accordingly, there are ongoing efforts to, among other things, increase the number of memory cells that can be packed on a semiconductor wafer (or die).

For example, another type of flash memory is dual sided ONO flash memory, which allows multiple bits to be stored in a single cell. In this technology, a memory cell is essentially split into two identical (mirrored) or complementary regions, each of which is formulated for storing one of two independent bits. Each dual-sided ONO flash memory cell, like a traditional cell, has a gate, a source, and a drain. However, unlike a traditional stacked gate cell in which the source is always connected to an electrical source and the drain is always connected to an electrical drain, respective dual sided ONO flash memory cells can have the connections of the source and drain reversed during operation to permit the storing of two bits.

In virtual ground type architectures, dual sided ONO flash memory cells have a semiconductor substrate with conductive bitlines. A multilayer storage layer, referred to as a "charge-trapping dielectric layer", is formed over the semiconductor substrate. The charge-trapping dielectric layer can generally be composed of three separate layers: a first insulating layer, a charge-trapping layer, and a second insulating layer. Wordlines are formed over the charge-trapping dielectric layer substantially perpendicular to the bitlines. Programming circuitry controls two bits per cell by applying a signal to the wordline, which acts as a control gate, and changing bitline connections such that one bit is stored by the source and drain being connected in one arrangement and a complementary bit is stored by the source and drain being connected in another arrangement.

The closeness of such dual sided ONO flash architectures, however, also causes certain undesirable phenomena to become prevalent. For example, isolating two bits or charges stored within a charge trapping layer becomes increasingly difficult as the channel length is decreased and the bits are brought closer together. In this manner, the charge on the bits can contaminate or disturb one another, causing operations performed on the bits to be more challenging and introducing a greater opportunity for error, particularly as arrays become larger and denser. This interdependency or the affect that bits can have on one another is sometimes referred to as complementary bit disturb or CBD.

Similarly, because the bitlines of these high density arrays are close to the unselected neighboring bits and may receive a relatively high voltage, these adjacent bits may be prone to the effects of disturb conditions which may be referred to herein as adjacent bit disturb or ABD.

Regardless of the flash architecture employed, reliably and accurately programming multi-bit flash such as dual sided ONO flash and multi-level flash cells can be particularly sensitive with the attendant complications of maintaining narrow Vt distributions in order to accurately read and determine a data state from a corresponding Vt level. In addition, even if such narrow Vt distributions are attained for the various multiple levels, unless the memory cells can be programmed to within the acceptable limits quickly, efficiently, and reliably, little competitive advantage may be gained.

In view of the foregoing, a need exists for an improved system and method of quickly and efficiently controlling and driving multi-bit, and in particular, multi-level flash memory cells of a virtual ground array during write operations, while maintaining ABD control that achieves narrow Vt distributions of the programmed bit states.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The present invention provides a system and method that controls the switching transition times (rise-time and fall-time, or profile) of a write signal used for programming or erasing multi-bit and multi-level flash memory cells. In one or more embodiments, this goal may be accomplished by applying a ramped or otherwise controlled profile write voltage to the flash memory cells in order to avoid disturb issues to the unselected or non-targeted neighboring memory cells (ABD), which preserves the existing state of the neighboring cells while keeping the design as compact and manageable as possible yet maintains a high write speed. In addition, the system and method of the present invention is applicable to and reliable for various memory technologies, since the injected charge, for example, to steps or other such functional transitions of the ramped voltage profile can be adjusted (trimmed) to any level of resolution desired (e.g., with n trim-bits).

In one implementation, a flash memory comprises one or more bitline drivers configured to drive the bitlines of the flash memory, and a ramp controller configured to receive a program voltage and a plurality of trim bits, to generate a ramped voltage from the program voltage based on the plurality of trim bits, and to supply the ramped voltage to the one or more bitline drivers during write operations, wherein the ramped voltage comprises a predetermined profile.

In another implementation, a bitline drive circuit for generating a ramped voltage to the bitlines of a multi-bit flash memory array during write operations, comprises a ramp controller configured to receive a program voltage and a plurality of trim bits, and to generate a ramped voltage from the program voltage based on the plurality of trim bits, and to supply the ramped voltage to the bitlines during write operations, wherein the ramped voltage comprises a predetermined positive slope and a predetermined negative slope.

In one embodiment, the memory further comprises a multi-bit flash memory.

In another embodiment, the multi-bit flash memory further comprises a multi-level flash memory.

In still another embodiment, the predetermined profile further comprises a predetermined rising positive) slope and a predetermined falling (negative) slope.

In yet another embodiment, the predetermined profile comprises one or more ramp functions that are executed a predetermined number of times established by the plurality of trim bits.

In another embodiment, the one or more ramp functions comprise one or more of a step, a linear, a log, a sinusoidal, and a parabolic function.

In one embodiment, a ramp controller for generating a ramped voltage for programming bitlines of a flash memory array, comprises a charge pump configured to supply an unregulated voltage, and a programmable regulator configured receive a program voltage input and to regulate the unregulated voltage to a level based on a value of a trim bit input (e.g., one or more digital inputs) operable to set a number of times that the ramp voltage is to be subdivided into one or more ramp functions, and to transition the regulated voltage between subsequent levels based on subsequent trim bit inputs according to the one or more ramp functions. The ramp controller also includes an output driver circuit connected to the program voltage input and having a ramped voltage output, wherein the output driver is configured to provide a variable resistance between the program voltage input and the ramped voltage output, and wherein the variable resistance is based on the regulated voltage. A sequence of trim bit inputs provided to the programmable regulator transitions the resistance of the output driver in such a manner that the regulator voltage output transitions according to one of the ramp functions, thereby providing a ramped voltage for driving bitlines of the flash memory array during write operations.

In this way, the target cell of a wordline may be controllably and safely programmed, while avoiding the effects of adjacent bit disturb (ABD) to adjacent cells along the selected wordline.

The multi-bit multi-level (MLB) flash memory cells of the present invention may comprise a single physical bit that can be programmed, for example, to three or more data levels or data states corresponding to three or more threshold voltages. Alternately, the MLB cell may comprise a multi-bit flash or mirror-bit cell having two physically distinct bits that may each be programmed to multiple levels such as four, wherein 16 possible states are then available. The method may be suitably implemented in a variety of flash memory architectures including single and dual sided ONO flash EEPROM, and other such single or multi-bit memory architectures that may be electrically programmed, and any such cell or variant is contemplated as falling within the scope of the present invention.

The present invention also provides a method of generating a ramped voltage for programming bitlines of a flash memory array, comprising providing a supply voltage and a program voltage operable to program the bitlines of the array, generating and regulating from the supply voltage, a regulated voltage, generating a variable resistance in series with the program voltage based on the regulated voltage, and generating a ramped voltage based on the variable resistance and the program voltage, wherein the ramped voltage is operable to program the bitlines of the array.

The present invention thereby provides a method of programming a wordline of an array of MLB memory cells that yields a well controlled narrow Vt distribution using minimal programming time, while maintaining ABD control.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

DETAILED DESCRIPTION OF THE INVENTION

Figure 1:
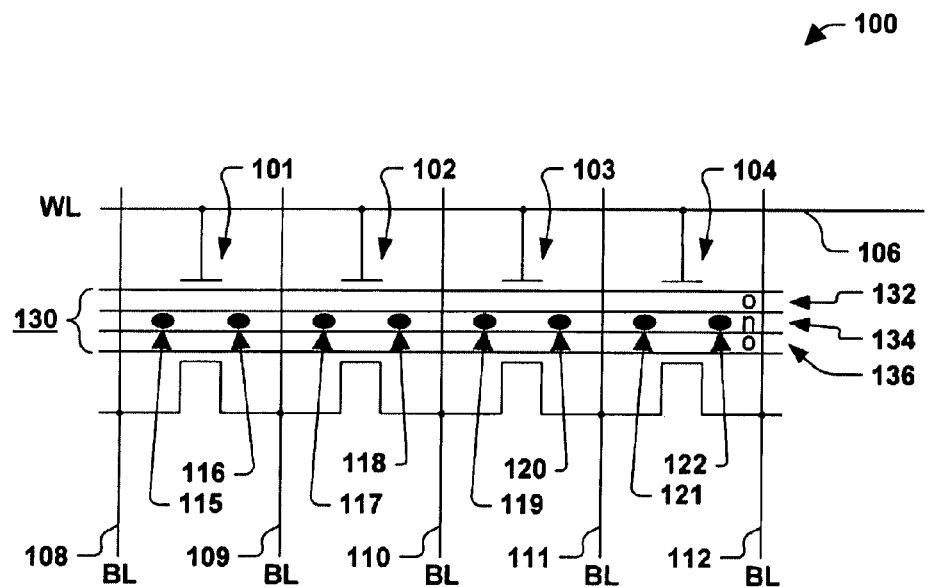
FIG. 1 is a schematic illustration of a portion of a wordline of multi-bit flash memory cells such as dual sided ONO flash memory cells.

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, well-known structures and devices are shown in block diagram form in order to facilitate describing one or more aspects of the present invention.

Improvements in the density of memory devices translate to increased memory capacity. Density and thus capacity is a major consideration in the cost of fabrication and the marketability of memory devices, and is directly related to the amount of real estate used to store a bit of information on a semiconductor chip. Density may be increased, for example, by scaling down feature size to accommodate more memory cell transistors on a given size chip thereby achieving higher density. Another technique to increase density and reduce manufacturing costs is thru the use of multi-bit (multiple physical bits per cell) and multi-level cell technologies.

Multi-level cells increase cell density by increasing the number of possible logical states or data states associated with a cell, thereby allowing a single memory cell to store information corresponding to more than one data bit. One way this has been done is by using multiple (three or more, in the context of cell levels and states) threshold voltage (Vt) levels, which correspond to multiple data states per cell. This contrasts to the two states and levels used in conventional flash memory cells. Thus, in one example, a single dual sided ONO flash cell (or Mirror-Bit cell) may have two physical bits of data each at four or more Vt levels corresponding to four logical states. Cells, having multiple levels, however, present many new problems attempting to maintain well controlled or tight distributions of the Vt levels, particularly as larger data bit quantities are considered.

As a result of these trends, accurate programming, erasure, and the determination of the levels of such multi-level cells becomes increasingly demanding, particularly as higher bit capacities are expected of a single cell. Accordingly, multi-level memory cells need to be programmed quickly and efficiently to save program operations time and power consumption. In addition, the cells need to be programmed to a well controlled narrow program Vt distribution (tight bit compacting). Such device requirements and issues are likely to increase as device features continue to shrink and the density of memory cells increases.

As indicated previously, however, due to such high density architectures that include dual sided ONO flash type cell structures, the charge on the bitlines can contaminate or disturb the unselected neighboring or adjacent bits referred to as adjacent bit disturb or ABD. This affect that a bitline can have on the unselected adjacent bits causes operations performed on the bits to become more challenging and introducing greater opportunity for error.

In particular, as memory cells continue to be manufactured to higher levels of density, the sensitivity to disturb conditions exponentially increases with the reduced cell sizes. Serious disturb conditions occur during expedited write operations and can change the data permanently in an undesired location. Higher density and smaller die size expectations are making the disturb condition a lot more severe to handle. In addition, there is a growing trend toward increased capacitive loading along wordlines and bitlines associated with the larger numbers of memory cells accessed in the larger arrays. As a result, the unselected or non-targeted neighboring memory cells along a wordline, for example, may become disturbed, particularly in virtual ground memory array architectures.

Accordingly, it is a goal of the present invention to provide a system which preserves the existing state of the neighboring cells while keeping the design as compact and manageable as possible yet maintains a high write speed.

Referring initially to FIG. 1, a schematic illustration is presented of a portion of a wordline of multi-bit flash memory cells such as dual sided ONO flash memory cells 100 such as may be included in at least part of an array of multi-level flash memory cells. The circuit schematic shows a group of memory cells 101 through 104 in a virtual ground type implementation, for example. The respective memory cells 101 through 104 are connected to a wordline 106, which serves as a control gate, and pairs of the memory cells share a common bitline. For instance, in the example shown, the memory cell 101 has associated bitlines 108 and 109; the memory cell 102 has associated bitlines 109 and 110; the memory cell 103 has associated bitlines 110 and 111; and the memory cell 104 has associated bitlines 111 and 112. As such, cells 101 and 102 share bitline 109, cells 102 and 103 share bitline 110 and cells 103 and 104 share bitline 111, respectively.

Depending upon wordline voltages and bitline connections, the memory cells 101 through 104 are capable of writing, reading, and erasing bits at locations 115 through 122. In addition to voltages applied to the wordline 106, reading the bit (e.g., "A" bit of cell 101) at location 115, for example, is achieved through connection of the drain to the bitline 109 and the source to the bitline 108. Similarly, reading the bit (e.g., "B" bit of cell 101) at location 116 is achieved through connection of the drain to the bitline 108 and the source to the bitline 109. Storage of multiple bits is made possible, at least in part, by a charge trapping dielectric layer 130 interposed between the bitlines and the wordline. The charge trapping dielectric layer 130 includes multiple insulating layers 132, 136 (e.g., of oxide based material) that sandwich a charge trapping layer 134 (e.g., of nitride based material). Given its layer to layer composition, the charge trapping dielectric layer 130 is often referred to as an ONO layer (for the oxide, nitride, oxide layers).

The ONO layer 130 allows the different bits to be stored at multiple states or levels as well. For example, depending upon the voltage applied to the memory cells 101 through 104 by the control gate or wordline 106 during programming, varying amounts of charge can be stored at locations 115 through 122. The different amounts of charge may correspond to different bit states or levels, for example. If four different charge levels or data levels (e.g., 1, 2, 3 and 4) can be stored at each of the bit locations 115 through 122, for example, then each two-bit cell 101 through 104 can have 16 different combinations of stored data (e.g., 1-1, 1-2, 1-3, 1-4, 2-1, 2-2, 2-3, 2-4, 3-1, 3-2, 3-3, 3-4, 4-1, 4-2, 4-3 and 4-4).

Figure 2:
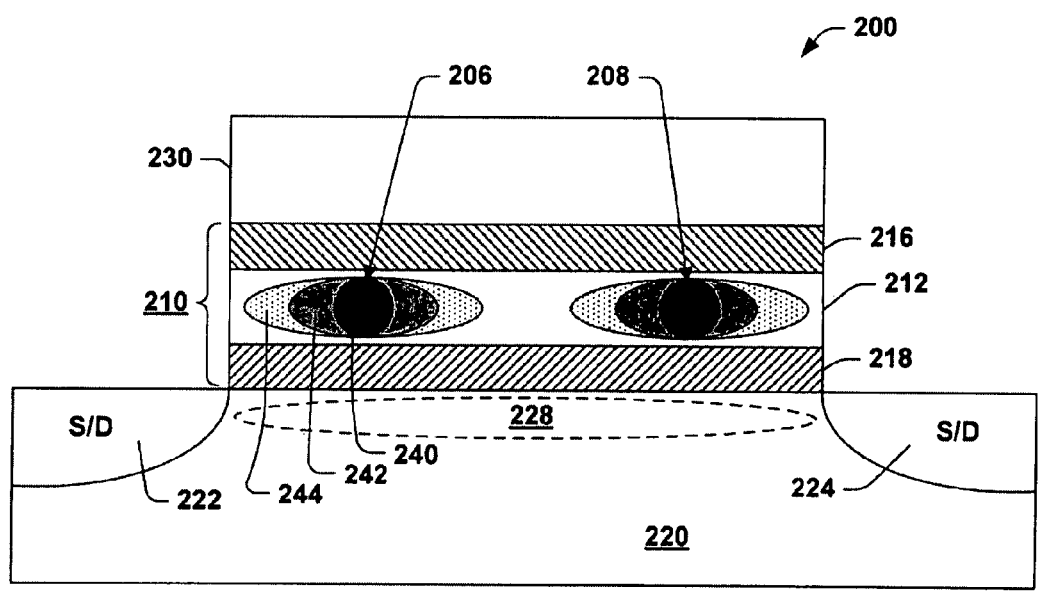
FIG. 2 is a cross-sectional view of a multi-bit flash memory cell wherein each of the bits can be stored at multiple levels.

FIG. 2 is a cross sectional view of a multi-bit flash memory cell 200 wherein each of the bits can be stored at multiple levels, and further illustrating the capability of the cell to store varying degrees of charge at bit locations 206 and 208. It will be appreciated that the memory cell 200 may, for example, correspond to the memory cells 101 through 104 depicted in FIG. 1. The cell 200 includes a charge trapping dielectric layer (ONO layer) 210 that comprises a charge trapping layer 212 sandwiched between two dielectric layers 216, 218. The charge trapping layer 212 is formed from one or more substantially non-conductive substances, such as nitride based materials. The dielectric layers 216, 218 are similarly formed from one or more electrically insulating substances, such as oxide based materials.

The charge trapping ONO layer 210 is formed over a substrate 220 that may be formed from silicon or some other semiconductor material, for example. The substrate 220 may be selectively doped with a p-type dopant, such as boron, for example, to alter its electrical properties. In the example illustrated, the substrate 220 has buried bitlines or bitline diffusions including a first bitline diffusion 222 and a second bitline diffusion 224. The bitline diffusions 222 and 224 may, for example, be formed by an implanted n-type dopant, and may correspond to bitlines 108 through 112 in FIG. 1. A channel 228 is defined within the substrate between the first 222 and second 224 bitline diffusions (e.g., S/D extensions, deep S/D regions).

Overlying the upper dielectric layer 216 of the ONO layer 210 is a gate 230. This gate 230 may be formed from a polysilicon material, for example, and may be doped with an n-type impurity (e.g., phosphorus) to alter its electrical behavior. The gate 230 may, for example, correspond to the wordlines 106 in FIG. 1. The gate 230 enables a voltage to be applied to the cell 230 such that respective charges can, among other things, be stored within the cell at locations 206, 208, depending upon the electrical connections of the bitline diffusions 222, 224.

The multi-bit or dual sided ONO flash memory cell 200 is generally symmetrical, thus the bitline diffusions 222 and. 224 are interchangeable as acting source and drain. Thus, the first bitline diffusion 222 may serve as the source and the second bitline diffusion 224 as the drain with respect to right bit location 208 for programming. Likewise, the second bitline diffusion 224 may serve as the source and the first bitline diffusion 222 as the drain for the left bit location 206 for programming. The cell 200 can be programmed by applying a voltage across the gate 230 and an acting drain region, and connecting an acting source region to ground.

When programming the cell 200, the acting drain region is typically biased to a potential above the acting source. As a result of the gate bias, a high electric field is applied across the charge trapping layer 212. Due to a phenomenon known as "hot electron injection", electrons pass from the acting source region through the lower dielectric layer 218 and become trapped in the charge trapping layer 212 at locations 206 or 208. It will be appreciated that a second bit can be programmed to the alternate location 208 or 206 by reversing the acting source and drain and again applying a bias to the control gate 230.

By way of example, the left bit location 206 can be programmed by applying a program voltage to the gate 230 and a drain voltage to the second bitline 222, which is an acting drain for the left location 206. The first bitline 224, which is an acting source for programming the left bit location 206, can be connected to ground, or biased to a different voltage level. The applied voltages generate a vertical electric field through the dielectric layers 218 and 216 and also through the charge trapping layer 212, and generate a lateral electric field across a length of the channel 228 from the first bitline diffusion 222 to the second bitline diffusion 224. At a given voltage, the channel 228 inverts such that electrons are drawn off the acting source (the first bitline diffusion 224 in this example) and begin accelerating towards the acting drain (the second bitline diffusion 222 in this example).

As the electrons move along the length of the channel 228, the electrons gain energy and, upon attaining enough energy, the electrons jump over the potential barrier of the bottom dielectric layer 218 and into the charge trapping layer 212, where the electrons become trapped. The probability of electrons jumping the potential barrier in this arrangement is a maximum in the area of the left bit location 206, adjacent the first bitline diffusion 222, where the electrons have gained the most energy. These accelerated electrons are termed hot electrons and, once injected into the charge trapping layer 212, stay in about the general area indicated for the left bit. The trapped electrons tend to remain generally localized due to the low conductivity of the charge trapping layer 212 and the low lateral electric field therein. Programming the right bit location 208 is similar, but the first bitline 224 operates as an acting drain and the second 222 operates as an acting source.

For a read operation, a certain voltage bias is applied across an acting drain to an acting source of the cell 200. The acting drain of the cell is a bitline, which may be connected to the drains of other cells in a byte or word group. A voltage is then applied to the gate 230 (e.g., the wordline) of the memory cell 200 in order to cause a current to flow from the acting drain to the acting source. The resulting current is measured, by which a determination is made as to the value of the data stored in the cell. For example, if the current is above a certain threshold, the bit is deemed unprogrammed or a logical one, whereas if the current is below a certain threshold, the bit is deemed to be programmed or a logical zero. A second bit can be read by reversing operations of the first and second bitline diffusions 222 and 224 for the acting drain and the acting source.

It can be appreciated that if the voltages utilized to program the left 206 and right 208 bit locations of the cell 200 are increased or sustained for longer periods of time, the number of electrons or amount of charge stored at these locations can be increased or otherwise varied. This allows the cell 200 to be utilized for additional data storage. For example, different amounts of charge can correspond to different programmed states. In the example illustrated, for instance, both the left 206 and right 208 bit locations can be said to have four different states or levels, namely 1, 2, 3 and 4, where level 1 (L1) corresponds to a situation where the locations are blank or un-programmed, and levels 2, 3 and 4 (L2, L3, and L4, respectively) correspond to increased amounts of stored charge, respectively. With regard to the left bit location 206, for example, a level 2 may correspond to a relatively small amount of stored charge 240, while levels 3 and 4 may correspond to increasingly larger amounts of stored charge 242 and 244, respectively. As indicated previously, this technique is also called multi-level cell technology, which is useful to increase density and reduce manufacturing costs.

Multi-level cells increase the effective cell density by increasing the number of possible logical states or data states associated with a cell, thereby allowing a single memory cell to store information corresponding to more than one data bit. One way this has been done is by using multiple (three or more, in the context of cell levels and states) threshold voltage (Vt) levels, which correspond to multiple data states per cell. This contrasts to the two states or levels used in conventional flash memory cells. Thus, in the example above, a single multi-bit or dual sided ONO flash cell may store in each of its two physical bits four Vt levels corresponding to four logical states. The four-level MLB cell may comprise a single physical bit that can be programmed to two levels or more (plus a blank level), or alternatively, may comprise a dual sided ONO flash cell having two physically distinct bits that may each have multiple levels such as four, wherein 16 or more possible combinations of states can exist between two bits.

As discussed above, however, the unselected neighboring cells may be prone to the effects of disturb conditions particularly in the small cells of high density arrays.

Figure 3:
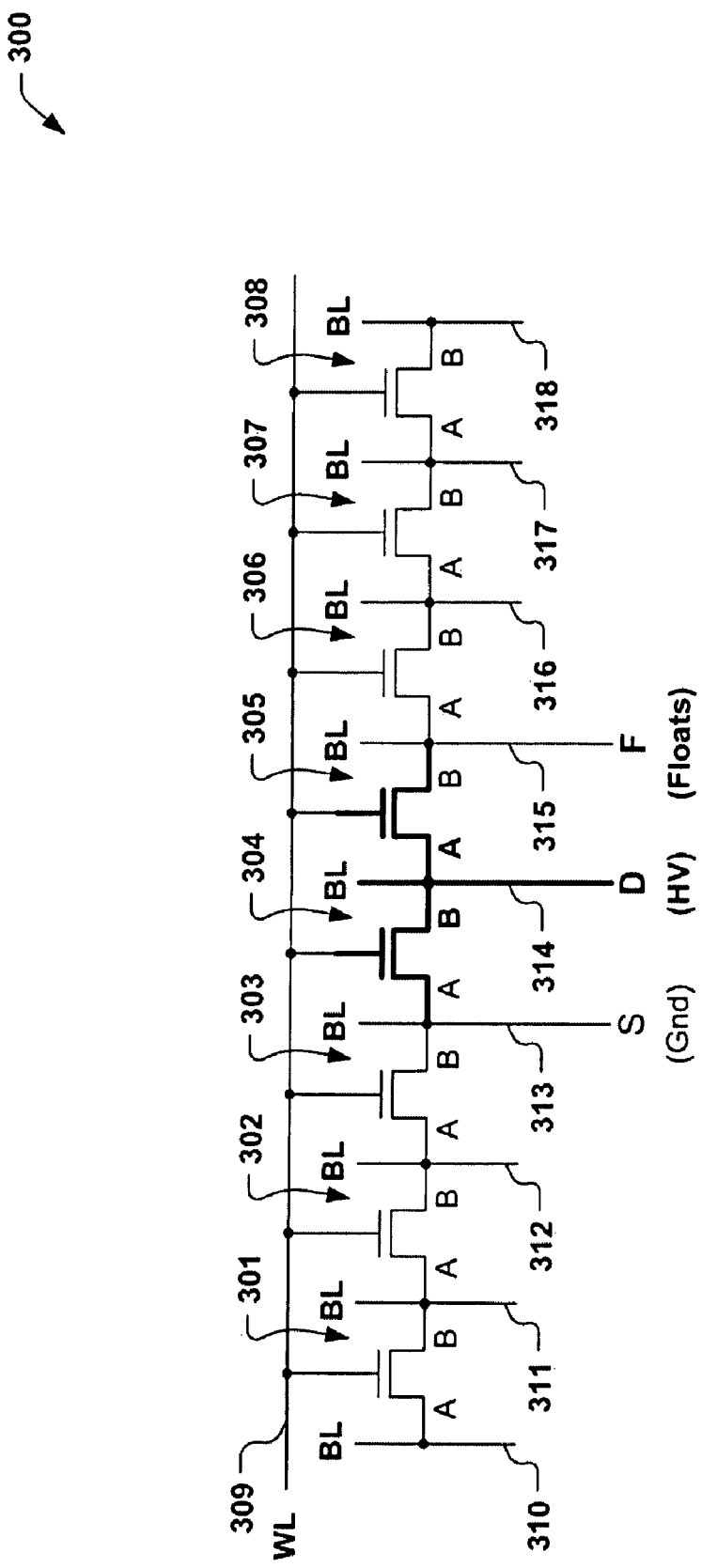
FIG. 3 is a partial wordline of an array of multi-bit flash memory cells in accordance with an aspect of the present invention and such as may apply to the multi-bit flash memory cell of FIG. 2.

For example, FIG. 3 illustrates a partial wordline 300 of an array of multi-bit flash memory cells such as flash memory cell 200 of FIG. 2 in accordance with an aspect of the present invention, and such as may be included in at least part of an array of multi-level flash memory cells. Partial wordline 300 shows a group of memory cells 301 through 308 in a virtual ground type implementation, for example. The respective memory cells 301 through 308 are connected to a wordline WL 309, which serves as a control gate, and pairs of the memory cells share a common bitline.

For example, the memory cell 301 has associated bitlines BL 310 and BL 311; the memory cell 302 has associated bitlines BL 311 and BL 312; the memory cell 303 has associated bitlines BL 312 and BL 313; the memory cell 304 has associated bitlines BL 313 and BL 314; the memory cell 305 has associated bitlines BL 314 and BL 315; the memory cell 306 has associated bitlines BL 315 and BL 316; the memory cell 307 has associated bitlines BL 316 and BL 317; and the memory cell 308 has associated bitlines BL 317 and BL 318.

As such, cells 301 and 302 share bitline BL 311, cells 302 and 303 share bitline BL 312, cells 303 and 304 share bitline BL 313, cells 304 and 305 share bitline BL 314, cells 305 and 306 share bitline BL 315, cells 306 and 307 share bitline BL 316, and cells 307 and 308 share bitline BL 317, respectively.

Depending upon wordline voltages and bitline connections, the memory cells 301 through 308 are capable of writing, reading, and erasing bits at locations "A" and "B" within each cell. In addition to voltages applied to the wordline WL 309, reading the "A" bit of cell 304, for example, is achieved through connection of the drain "D" to the bitline BL 314 and the source "S" to the bitline BL 313. Similarly, reading the "B" bit of cell 304 is achieved through connection of the drain "D" to the bitline BL 313 and the source "S" to the bitline BL 314.

In a virtual ground memory array, the current ultimate goal is to achieve higher write speeds and preserve the existing state of the neighboring cells while keeping the design as compact and manageable as possible.

Increasing the electric field applied to the memory cell will provide this ultimate write speed goal; however, this particular strategy can result in an unwanted and irreversible data change on a nearby cell. This side effect is caused by the floating neighboring bitlines "F" 315 of FIG. 3 and their slow capacitive coupling up/down behavior with respect to the high voltage (HV) driven bitline "D" 314 of FIG. 3, while the rising or falling transition of bitline D 314 is in progress and the source bitline "S" 313 of FIG. 3 is nominally close to ground (Gnd) potential. For higher density applications, slow coupling ramp behavior may be more predominant due to the excessive capacitive loading on the bitlines.

Current power supplies, for example, comprising charge pumps and regulators, are designed to meet the high write speed demand, hence they are built very strong to accommodate increasing leakages through cycling and lifetime of the chip. In addition, because such supplies need to meet the demands of increasing wordline and bitline lengths and as well as capacitive loading, the robustness of these power supplies and output regulators has also had to increase. As a result of this increased supply and regulation robustness, shorter transition times (rise and fall times) may be provided at their output.

For example, once the charge pump to the bit line D 314 is connected thorough the regulator, and depending on the total bitline loading it sees, bit line D 314 can reach its final level within 10 ns to 20 ns starting from about ground potential. If the coupling behavior of floating bitline F 315 next to this fast ramping metal bitline D 314 is not as fast to respond to its neighbor's potential change over time $\Delta t$ (i.e. $\Delta V/\Delta t$), then a reverse potential difference may occur between bitlines D 314 and F 315. During this short transition time or transient phase, the wordline WL 309 is already stable at a high voltage, hence, any reverse potential difference (between D and F) is a write stimulus to the neighbor cell (e.g., A of cell 305). This is the detrimental ABD disturb mechanism.

In addition, because of the capacitive differences between the cells, such short transition times in the supply output also induces a greater reverse potential difference between the selected and unselected bitlines, which further exacerbates the disturb mechanism.

In order to speed up the write operation, there is not only a need to write fast but also to discharge the high voltages from the core/periphery and proceed with the next instruction. Hence, the same phenomenon described above for the charging (rise time) case is also valid for the discharging (fall time) case. Again, depending on the strength of the discharge path, bitline D 314 can dump its charge to ground as fast, and the slow coupling down speed of floating bitline F 315 can create another disturb scenario.

Figure 4:
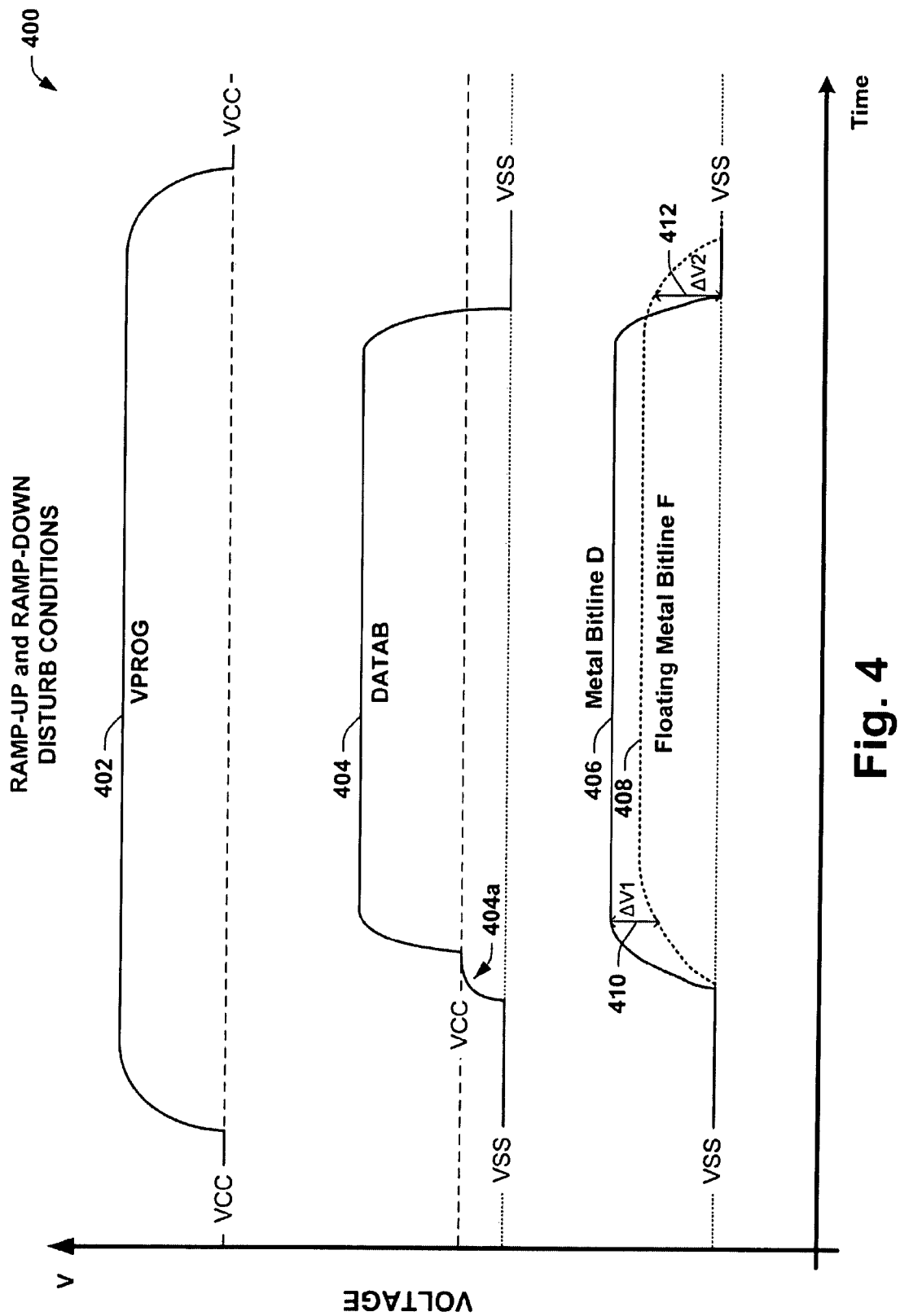
FIG. 4 is a plot of prior art program, data and bitline voltages such as may be applied to the bitlines of an array of prior art multi-bit flash memory cells during a write operation.

FIG. 4, for example, illustrates a plot 400 of prior art program voltage VPROG 402, data voltage DATAB 404, and voltages on a selected (driven) metal bitline D 406 (e.g., bitline D 314 of FIG. 3), and unselected (floating) metal bitline F 408 (e.g., bitline F 315 of FIG. 3) such as may be applied to the bitlines of an array of prior art multi-bit flash memory cells during a write operation. FIG. 4 illustrates uncontrolled transient behavior and transition times of such bitlines, for example, without a controlled ramp mechanism.

FIG. 4 further illustrates that DATAB 404 initially charges from VSS to VCC over segment 404a, then charges to a desired final voltage level. FIG. 4 also illustrates that the selected metal bitline D 406 quickly charges from VSS to a maximum voltage level, while the unselected metal bitline F 408 only capacitively couples from about VSS to a lower potential maximum voltage level. In addition, because of the capacitive coupling delays between the signal driven onto bitline D 406 and the signal induced onto bitline F 408, a detrimental potential difference is induced which is associated with the disturb mechanism. In particular, a charging or rise-time difference $\Delta V1$, 410 and a discharging or fall-time difference $\Delta V2$, 412 is induced between bitlines D 406 and F 408. In general, the larger these $\Delta V1$, 410 and $\Delta V2$, 412 potential differences are, the larger will be the impact of the disturb (ABD).

In one embodiment utilized in the present invention, a simple, reliable and cost effective solution is to control the release of the regulated voltage from the regulator output to the driver input, for example, by generally ramping or stepping the analog high voltage over a predetermined time period, thereby controlling the charge dump and rate of charge dump to the bitline system (e.g., via the bitline drivers, multiplexers or mux's). This way, the amount of the injected charge ($\Delta V/\Delta t$) is controllable and depending on the cell's sensitivity driven by the technology, such ($\Delta V/\Delta t$) steps are adjustable to a finer or a larger resolution.

Figure 5A:
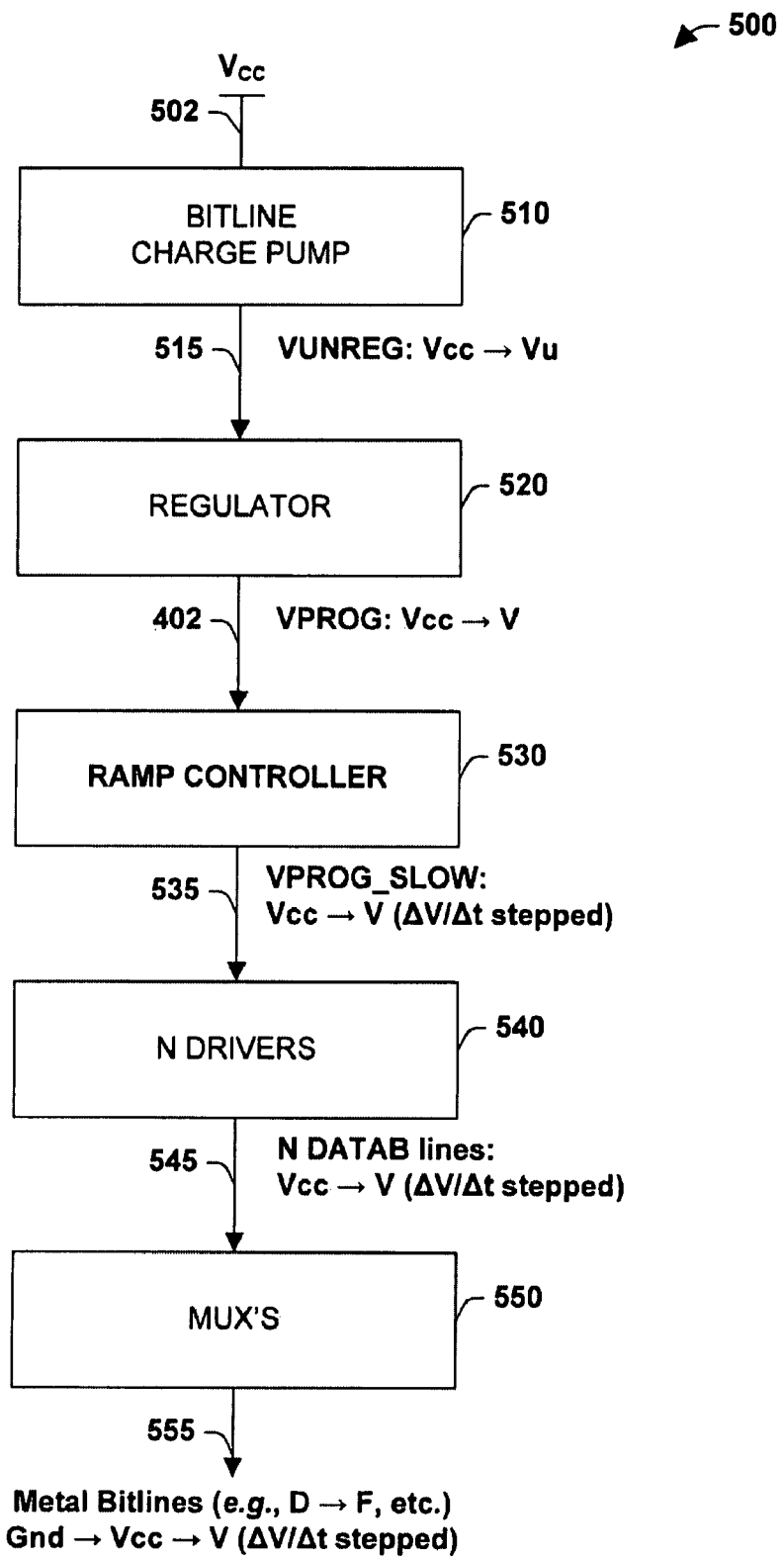
FIG. 5A is an exemplary bitline drive circuit utilizing a ramp controller such as may be used in accordance with several aspects of the present invention to drive metal bitlines of an array of multi-bit flash memory cells of FIG. 2 and the wordline of FIG. 3 during a write operation.

For example, FIG. 5A illustrates an exemplary bitline drive circuit 500 utilizing a ramp controller 530 in accordance with several aspects of the present invention to drive the bitlines of an array of multi-bit flash memory cells such as those of FIG. 2 during a write operation. The ramp controller 530 is configured to provide a ramped voltage which has a controllable positive and negative slope. The controllable slopes of the ramp controller 530 may comprise a number of steps, one or more linear ramps, sine, log, or any other such functional changes to the ramped voltage in order to moderate or otherwise control the time component $\Delta t$ or average slope rates ($\Delta V/\Delta t$) of the ramped voltage, such as that illustrated by metal bitline D waveform 555 of FIG. 6 described in greater detail infra.

The bitline drive circuit 500 of FIG. 5A, comprises a bitline charge pump 510 which generates from a VCC supply voltage 502, an unregulated voltage VUNREG 515 to a regulator 520. Regulator 520, then provides a regulated voltage VPROG 402 from the unregulated voltage VUNREG 515 to the ramp controller 530. As discussed above, the ramp controller 530 then generally controls the slope rates ($\Delta V/\Delta t$) of a ramped voltage, for example, the incremental and/or average positive and negative slopes of the ramped voltage at a VPROG_SLOW output 535 of the ramp controller 530 used to drive bitline drivers N DRIVERS 540. The N DRIVERS 540 boost the drive capability of the VPROG_SLOW output signal 535, driving N DATAB bitlines 545 and a number of multiplexers 550 over metal bitlines 555 (e.g., metal bitline D and F, etc.) with the ramped voltage VPROG_SLOW 535 output from the ramp controller 530.

Figure 5B:
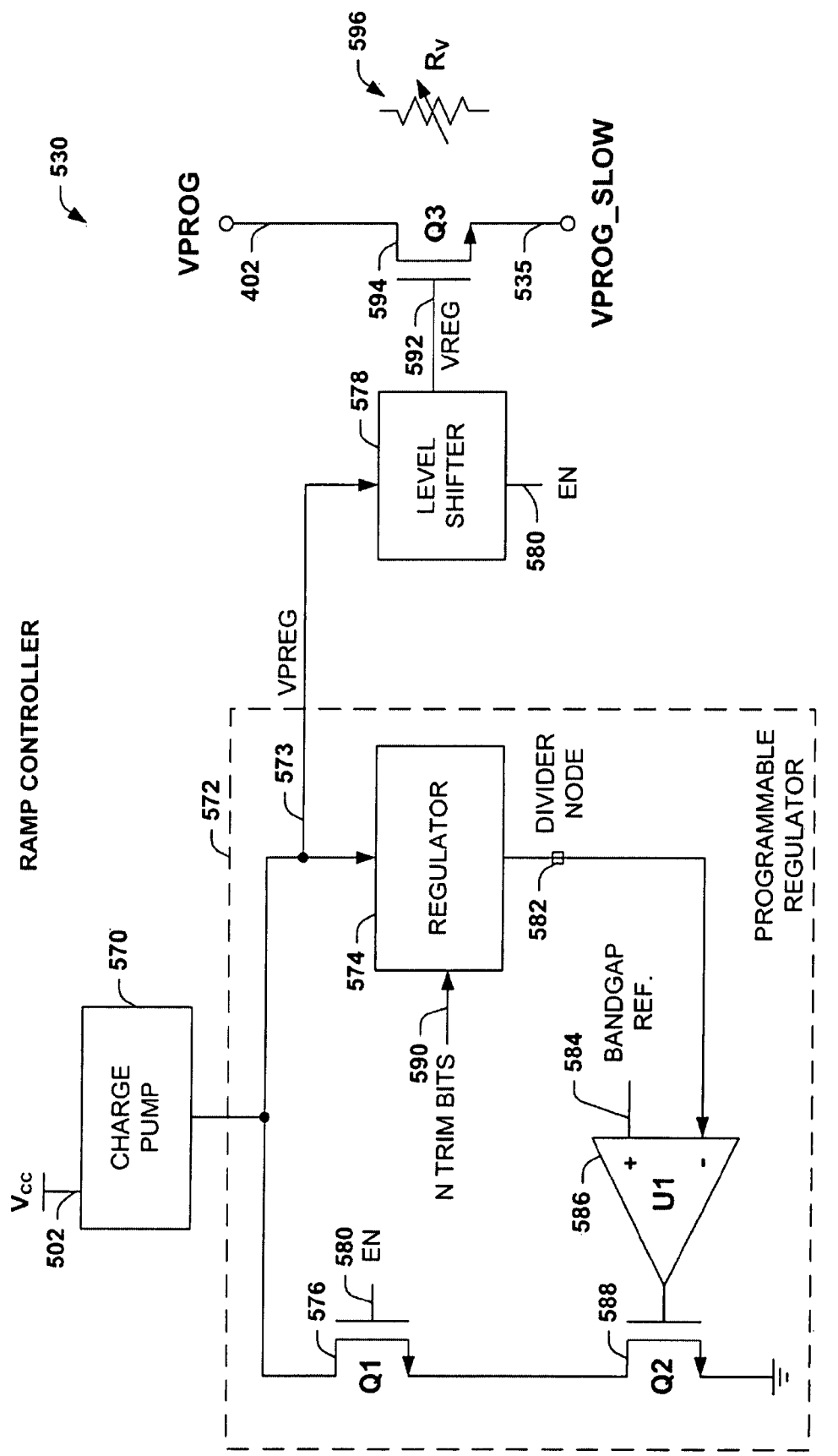
FIG. 5B illustrates further details of an exemplary ramp controller such as may be used in accordance with several aspects of the present invention in the exemplary bitline drive circuit of FIG. 5A during a write operation.

FIG. 5B further illustrates details of one exemplary ramp controller 530 such as may be used in accordance with several aspects of the present invention in the exemplary bitline drive circuit 500 of FIG. 5A during a write operation.

The ramp controller 530 of FIG. 5B, comprises another charge pump 570 which generates from a VCC supply voltage 502, a pre-regulation voltage VPREG 573 which is supplied to a programmable regulator circuit 572. The programmable regulator circuit 572, is then configured to fully regulate the pre-regulation voltage VPREG 573 which is supplied to level shifter 578 which supplies regulated voltage VREG 592 to the gate of an output driver transistor Q3 594 of the ramp controller 530. Output driver transistor Q3 594 is configured to translate the regulated voltage VREG 592 into, for example, an equivalent variable resistance $R_V$ 596. In this embodiment, the ramp controller 530 effectively places the variable resistance $R_V$ 596 in series with the VPROG 402 input voltage and outputs the ramped voltage VPROG_SLOW 535 from the ramp controller 530.

In operation; when enable input EN 580 goes high, for example, at switch Q1 576 and level shifter 578, the programmable regulator 572 and level shifter 578 are enabled, wherein regulator 574 starts regulating until a divider node output 582 is substantially equal to a bandgap reference level 584 based on an initial (e.g., lowest) N TRIM BITS input 590, for example, one or more or a plurality of digital inputs, input from a state machine (not shown). Thus, the regulator 572 is configured to provide a regulated voltage output at divider node 582 that is a function of a number, setting, or level N supplied by input 590. Comparator 586 provides a difference signal to driver transistor Q2 588 based on a comparison between the voltage on the divider node 582 and the bandgap reference voltage 584.

During this equalization of regulator 572, VREG 592 on the gate of transistor Q3 594 starts ramping up towards a target level to provide the first step or ramp of the ramped voltage output VPROG_SLOW 535 as transistor Q3 594 slowly turns on.

Then, the N TRIM BITS input 590 setting increases, for example, to a next level. Because the programmable regulator 572 is configured to equalize the divider node 582 to the bandgap reference 584, VREG 592 once again starts increasing, for example, and thus transistor Q3 594 conducts harder. Then, and depending on the number of steps (e.g., N), this process is repeated and Q3 594 conducts more, for example, until VPROG_SLOW 535=VPROG 402 is achieved. Thereafter, this level of conduction, (VPROG_SLOW 535=VPROG 402) may be maintained, for example, while the N TRIM BITS input setting is stable.

Then, after the write operation (or to complete the write operation) the reverse of the above operation may be applied to reduce or discharge the VPROG_SLOW 535 ramped voltage to the bitlines. In particular, the NTRIM BITS 590 setting decreases sequentially back toward the initial N TRIM BITS 590 setting. Again, the programmable regulator 572 is configured to equalize the divider node 582 to the bandgap reference 584, so VREG 592 starts decreasing, for example, causing transistor Q3 594 to conduct less. Thereafter, and again depending on the number of steps (e.g., N), this process is repeated and Q3 594 continues to conduct less, for example, until VPROG_SLOW 535=VCC 502 is achieved and the N TRIM BITS input is back to the initial setting.

It will be further appreciated that the N TRIM BITS input 590 (e.g., plurality of trim bits) may be used by the ramp controller 530 to set a number of times that each positive or negative slope of the ramp voltage is subdivided into one or more ramp functions, and may also be used to designate the shape "function" of the ramp function, including the slope of the ramp functions, or any other such functions or trim settings of the ramped voltage.

Although the output driver transistor Q3 594 of FIG. 5B has been discussed and illustrated in the context of providing a variable resistance or a variable conduction, any other such output driver or drive circuit may be used to provide ramped voltage control to the output VPROG_SLOW 535, and is contemplated herein.

Figure 6:
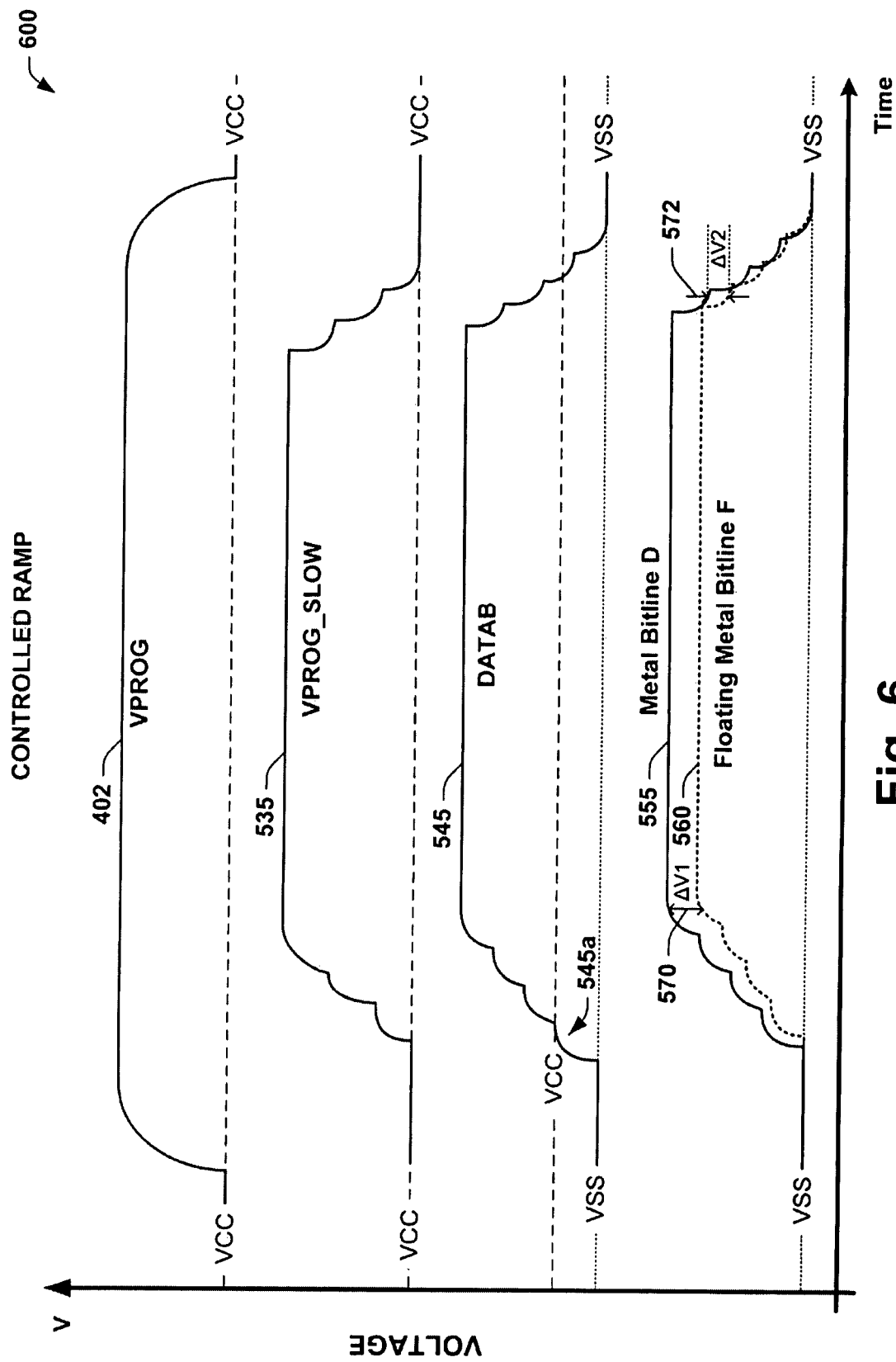
FIGS. 6 and 7 are plots of exemplary program voltage, ramped voltage, data voltage, and bitline voltage such as may be applied to the bitlines of an array of multi-bit flash memory cells generated by the exemplary ramp controller of FIGS. 5A or 5B during a write operation.
Figure 7:
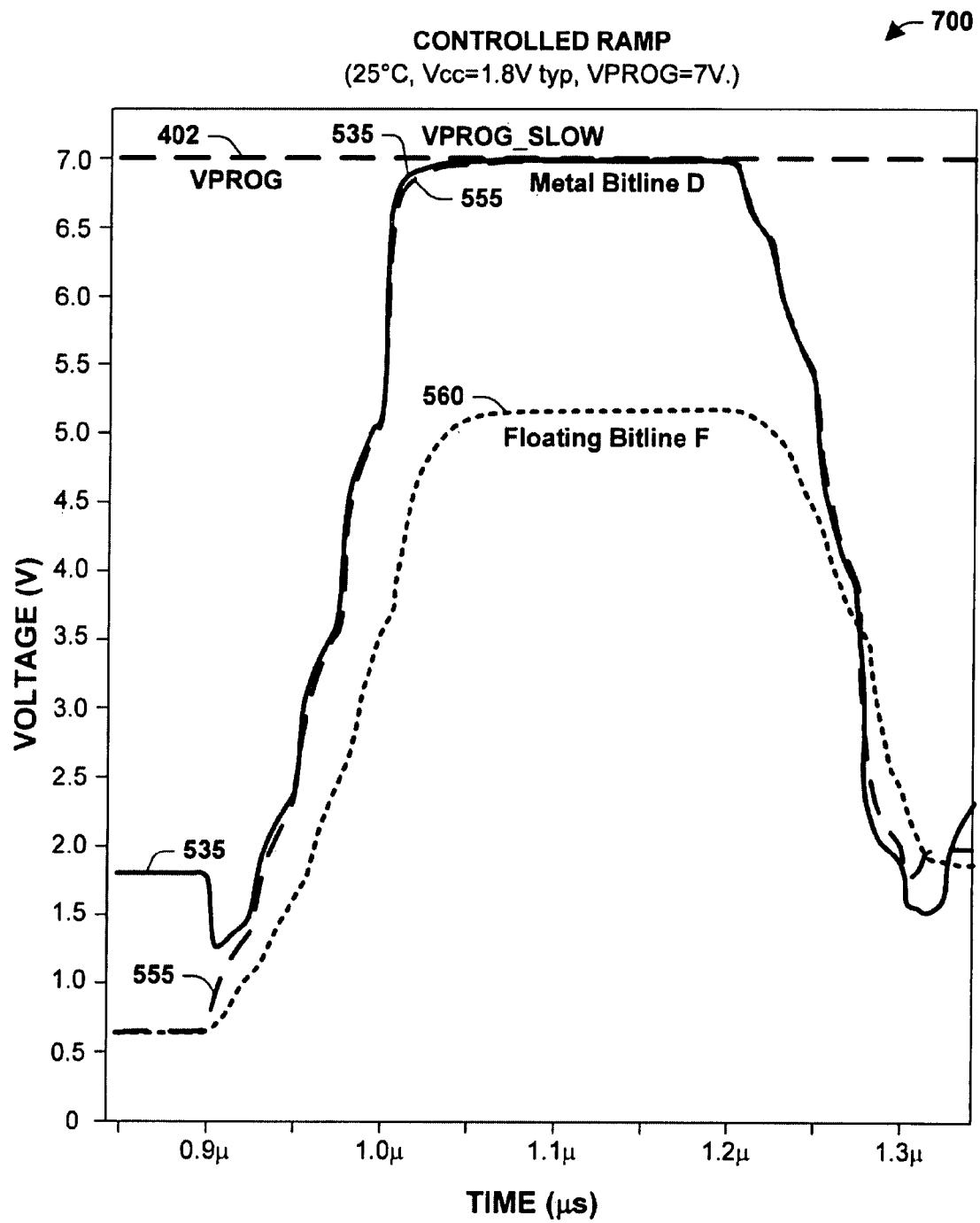

As a result of stepping or otherwise controlling the ramping of the driven high voltage on the bitlines, floating bitline behavior is controlled within a tolerable ΔV window as will be shown hereafter in FIGS. 6 and 7. This approach enables improving the write speed while avoiding the risk of disturbing the neighbor cells through cycling.

FIGS. 6 and 7 illustrate an exemplary program voltage 402; ramped voltage VPROG_SLOW 535, data voltage DATAB 545, and a subsequent bitline voltage D 555 and floating bitline voltage F 560, such as may be applied to the bitlines of an array of multi-bit flash memory cells generated by the exemplary ramp controller 530 of FIGS. 5A and 5B during a write operation. In the example of FIG. 6, three successive steps are utilized and illustrated in VPROG_SLOW 535 to generally slow the program voltage ramp rate between the VCC 502 level and the full VPROG voltage level 402 (over both the positive and negative slope transitions). Note that VPROG 402 is stable at this full VPROG 402 voltage level during the generation of the ramped voltage 535 and the resultant DATAB voltage 545 and the bitline voltages 555 and 560.

FIG. 6 also illustrates that as DATAB 545 begins from a lower VSS level, an additional step is added at waveform segment 545a between VSS and VCC, thus DATAB 545 comprises four successive steps to generally slow the ramp rate between the VCC 502 level and the full VPROG voltage level 402 (over both the positive and negative slope transitions). Thus, the slowed ramp rates of the bitline voltage D 555 and floating bitline voltage F 560, provided as a result of the ramp controller 530 of the present invention, minimizes a charging or rise-time difference ΔV1, 570 and a discharging or fall-time difference ΔV2, 572 that is induced between bitlines D 555 and F 560, such as may be applied to bitline D 314 and may result at floating bitline F 315 of FIG. 3. In general, therefore, the smaller these ΔV1, 570 and ΔV2, 572 potential differences are, the smaller will be the impact of the disturb (ABD).

Similarly, FIG. 7 illustrates exemplary voltage waveforms provided utilizing a ramp controller such as ramp controller 530 of FIGS. 5A and 5B, using five N TRIM Bits step levels between VSS and VPROG 402. Again, any number of steps or ramps may be utilized to achieve any desired slope, shape, or functional control that the technology may require.

It will be appreciated that the ramped voltage waveforms provided by the ramp controller 530 of the present invention effectively represent a predetermined voltage profile comprising, for example, one or more ramp functions that are executed a predetermined number of times over the positive (e.g., increasing) and negative (e.g., decreasing) slopes of the predetermined profile.

It will be further appreciated that the one or more ramp functions may comprise one or more of a step, a linear, a log, a sinusoidal, and a parabolic function in accordance with the present invention. Thus, regardless of the shape of the waveform or the number of waveforms between the step increases and step decreases, the overall average slope may be controlled by the ramp controller (e.g., 530) in the context of the present invention.

The above described solution is simple and cost effective since the problem is resolved, for example, at the common source (e.g., near the bitline charge pump 510 and regulator 520 of FIG. 5A) with a single circuit (Ramp Controller 530 of FIGS. 5A and 5B). By contrast, if the problem is handled at or after the N Drivers of FIG. 5A, the number of circuits needed would be dramatically increased directly proportional to the read capacity of the chip=N~hundreds, for example. Again, this solution is also reliable since the injected charge steps of the ramp can be adjusted utilizing trimming (e.g., with N TRIM BITS 590 of FIG. 5B), because, even after the silicon has been received, trimming can be used to easily adjust the ramped write voltage to the requirements of the technology.

Accordingly, it is another goal of the present invention to provide a method of generating a ramped programming voltage for the metal bitlines of an array of suitable multi-bit MLB flash memory cells, which provides a simple and cost effective solution to minimize ABD effects with minimal circuitry, while also providing improved Vt program distributions, levels of write speed, endurance, and reliability over a variety of memory technologies.

The method of the present invention is suitably implemented in multi-bit and in particular, MLB memory devices having any number of levels and combinations of Vt distributions.

Although the methodology is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein. In addition, not all illustrated steps may be required to implement a methodology in accordance with one or more aspects of the present invention. Further, one or more of the acts may be carried out in one or more separate acts or phases.

Figure 8:
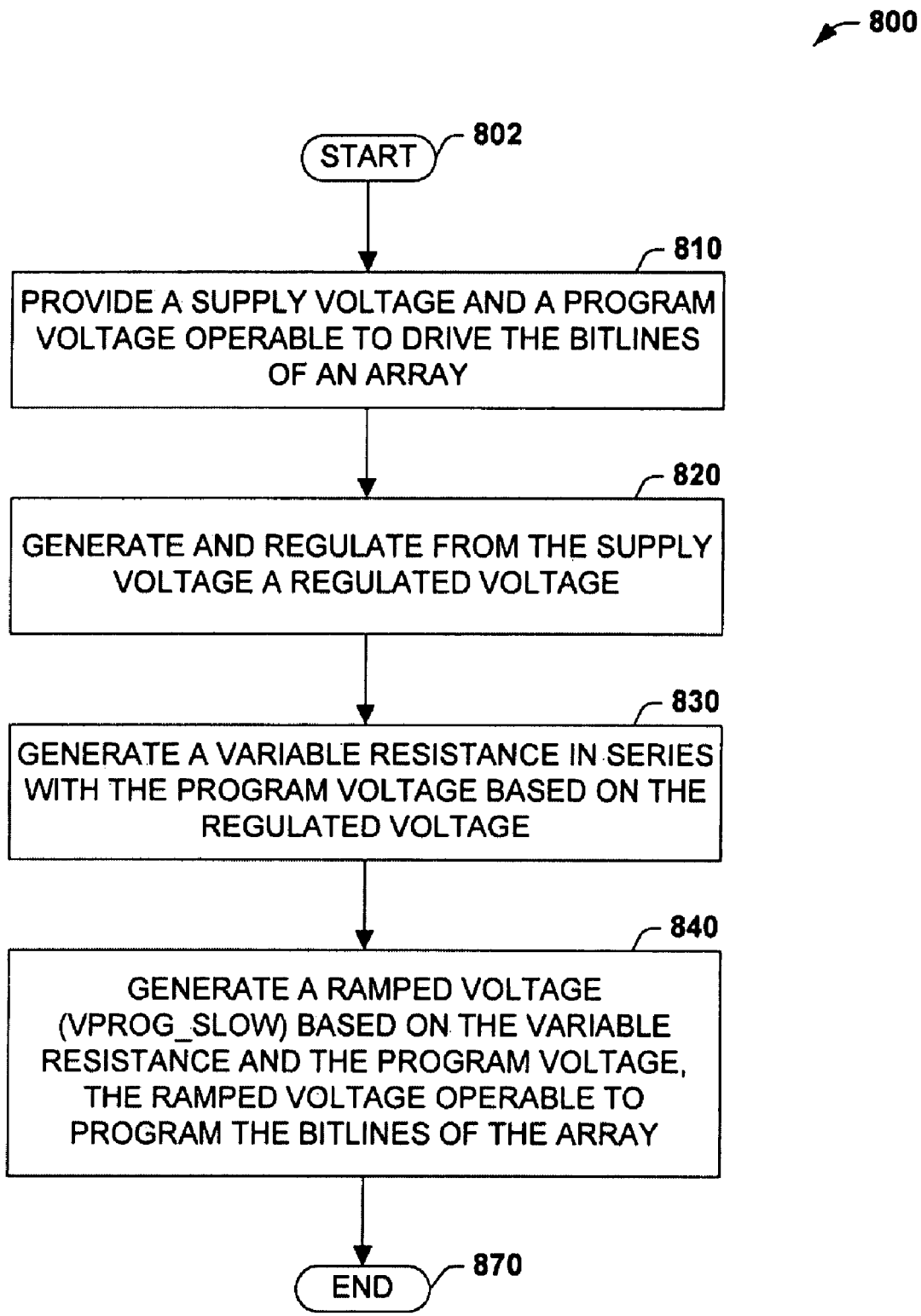
FIG. 8 is a flow diagram illustrating an exemplary method of generating a ramped voltage for the metal bitlines of an array of flash memory cells during a write operation.

FIG. 8 illustrates a flow diagram of an exemplary method 400 of generating a ramped voltage for the metal bitlines of an array of flash memory cells during a write operation in accordance with the present invention. While the term "wordline" or "array" is use throughout, it should be understood that such terms are not to be construed as limiting to one specified grouping of cells or bits, but rather may apply to any grouping of MLB cells including single or multi-bit cells. Assume for the sake of the following method discussion and the examples of FIG. 8, a ramp controller similar to ramp controller 530 of FIG. 5B, and a multi-bit flash memory cell comprising two bits-per cell (complementary bit-pair) having four-levels per bit similar to that of FIGS. 1-3.

For example, method 800 of FIG. 8 includes providing a supply voltage (e.g., Vcc 502 of FIG. 5B) and a program voltage (e.g., VPROG 402) operable to program the bitlines (e.g., BITLINE D 314 of FIG. 3 or 555 of FIG. 6) of the array (e.g., wordline array segment 300 of FIG. 3), generating (e.g., charge pump 570 of FIG. 5B) and regulating (e.g., regulator 572 of FIG. 5B) from the supply voltage (e.g., Vcc 502), a regulated voltage (e.g., VREG 592 of FIG. 5B), generating a variable resistance (e.g., $R_V$ 596 of FIG. 5B across Q3 594) in series with the program voltage (e.g., VPROG 402) based on the regulated voltage (e.g., VREG 592 of FIG. 5B), and generating a ramped voltage (e.g., VPROG_SLOW 535) based on the variable resistance (e.g., $R_V$ 596 of FIG. 5B) and the program voltage (e.g., VPROG 402), wherein the ramped voltage (e.g., VPROG_SLOW 535) is operable to program the bitlines (e.g., BITLINE D 314 of FIG. 3 or 555 of FIG. 6) of the array (e.g., array segment 300 of FIG. 3).

For example, the multi-level ramped voltage generation method 800 begins at 802. At 810 a supply voltage (e.g., Vcc 502 of FIG. 5B) and a program voltage (e.g., VPROG 402) operable to program the bitlines (e.g., BITLINE D 314 of FIG. 3 or 555 of FIG. 6) of the array (e.g., wordline array segment 300 of FIG. 3) are provided. For example, bitline charge pump 510 receives a supply voltage VCC 502 and generates an unregulated voltage VUNREG 515 which is then regulated by regulator 520 to VPROG 402 to a ramp controller 530 of FIGS. 5A and 5B.

At 820, a regulated voltage (e.g., VREG 592 via VPREG 573 of FIG. 5B) is generated, for example by charge pump 570 of FIG. 5B, and regulated, for example by regulator 572 of FIG. 5B from the supply voltage (e.g., Vcc 502). Intermediately, VREG 592 is provided by VPREG 573 from regulator 572.

At 830, a variable resistance (e.g., $R_V$ 596 of FIG. 5B) is generated, for example, by varying the conduction of transistor Q3 594 in series with the program voltage (e.g., VPROG 402) based on the regulated voltage (e.g., VREG 592 of FIG. 5B).

At 840, a ramped voltage (e.g., VPROG_SLOW 535) is generated, for example, based on the variable resistance (e.g., $R_V$ 596 of FIG. 5B) or a varying degree of conduction of transistor Q3 594 and the program voltage (e.g., VPROG 402), wherein the ramped voltage (e.g., VPROG_SLOW 535) is operable to program the bitlines (e.g., BITLINE D 314 of FIG. 3 or 555 of FIG. 6) of the array (e.g., array segment 300 of FIG. 3).

FIGS. 6 and 7 illustrate such exemplary ramped voltage profiles such as metal bitline D 555 and F 560 that are possible, for example, for a complementary bit-pair of flash memory cells, such as the flash memory cells 101-104 of FIG. 1 and cell 200 of FIG. 2. These voltage profiles are used for write operations to compensate for the ABD effects otherwise produced, for example, during programming complementary bit-pairs.

Other ramped voltage, write voltage, and such program profiles are anticipated in the context of the present invention, including voltage, pulse width, and step amplitude variations.

Figure 9:
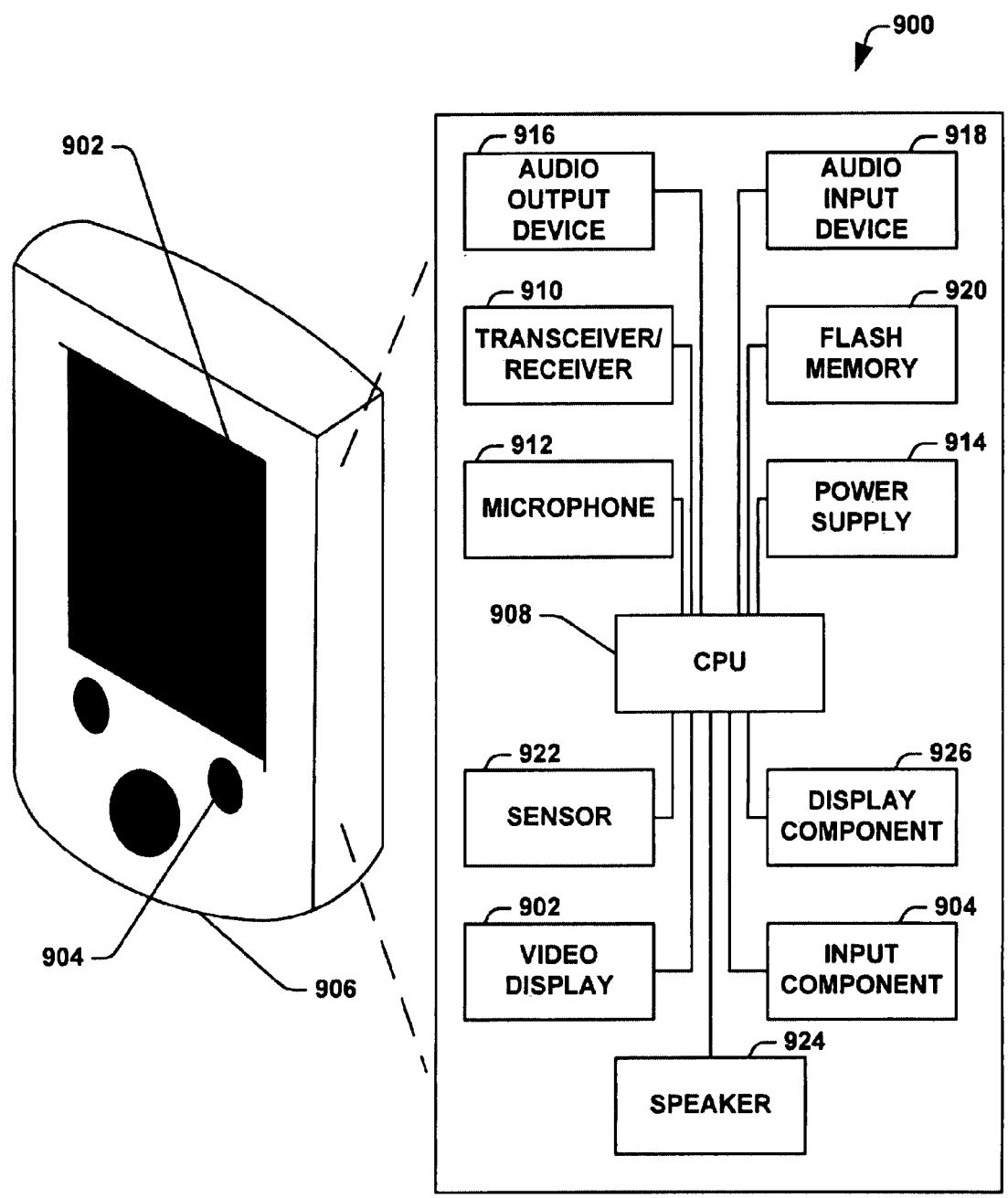
FIG. 9 is an isometric view of an electric device and block diagram, wherein a ramped controller may be utilized in a memory device according to other aspects of the present invention.

FIG. 9 illustrates an example of a (portable) electronic device, such as a communications device or Personal Data Assistant (PDA) 900, for example, where one or more aspects of the disclosure herein may be implemented. The communication device 900 comprises a video display 902, one or more user input components 904, a housing 906, a CPU 908, a transceiver and/or receiver 910, a microphone 912, a power supply 914, an audio output device 916, an audio input 918, a memory 920, various sensors 922, and speaker(s) 924. The memory 920 of the communication device 900 may comprise, for example, a bitline drive circuit and/or a ramp controller as described herein. The one or more user input components 904 can include a keypad, buttons, dials, pressure keys, and the like. The video display 902 can be a liquid crystal display, a plasma display, an LED display, and the like, for visually displaying information. The CPU 908 can be configured to communicate with the audio input device 918, the audio output device 916 and a display component 926. The display component 926 can be separate and distinct from the video display 902. The CPU 908 can execute control functions based on inputs from the user, entered using the one or more user input components 904, for example. Based on those inputs, for example the display component can display a graph, a photo, a map, a chart, a video, and the like.

The communication device 900 can also be configured to output data as an audio signal, for example a song, a message, a warning sound, various tones, recordings, etc. The communication device 900 can be configured to communicate with other electronic devices, for example computers, cell phones, other PDAs, and the like. The communication device 900 can also be configured to (wirelessly) transmit and/or receive data. This is done utilizing the transmitter/receiver 910 to either transmit or receive data. Additionally, sensors 922 can be utilized to sense data external to the PDA 900, for example, temperatures, radiation levels, pressures, and the like. It will be appreciated that an bitline drive circuit comprising a ramp controller circuit operable to apply a stepped or otherwise ramped write voltage profile to the memory cells of a flash memory device described herein can similarly be implemented in cell phones, memory sticks, flash drive devices, video camcorders, voice recorders, USB flash drives, fax machines, flash memory laptops, MP3 players, digital cameras, home video game consoles, hard drives, memory cards (used as solid-state disks in laptops), and the like.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A bitline drive circuit for generating a ramped voltage to the bitlines of a multi-bit flash memory array during write operations, comprising:
   a ramp controller configured to receive a program voltage and a plurality of trim bits, and to generate a ramped voltage from the program voltage based on the plurality of trim bits, and to supply the ramped voltage to the bitlines during write operations;
   wherein the ramped voltage comprises a predetermined positive slope and a predetermined negative slope.

2. The circuit of claim 1, further comprising one or more bitline drivers configured to receive the ramped voltage from the ramp controller and to drive the bitlines of the multi-bit flash memory array using the ramped voltage.

3. The circuit of claim 1, wherein the multi-bit flash memory array further comprises a multi-level flash memory array.

4. The circuit of claim 1, wherein the ramped voltage comprises one or more ramp functions that are executed a predetermined number of times established by the plurality of trim bits during the positive and negative slopes.

5. The circuit of claim 4, wherein the one or more ramp functions comprise one or more of a step, a linear, a log, a sinusoidal, and a parabolic function.

6. The circuit of claim 1, wherein the predetermined positive and negative slopes of the ramped voltage are adjusted based on the plurality of trim bits operable to set a number of times that the ramp voltage is to be subdivided into one or more ramp functions.

7. A flash memory, comprising:
one or more bitline drivers configured to drive the bitlines of the flash memory; and
a ramp controller configured to receive a program voltage and a plurality of trim bits, to generate a ramped voltage from the program voltage based on the plurality of trim bits, and to supply the ramped voltage to the one or more bitline drivers during write operations;
wherein the ramped voltage comprises a predetermined profile.

8. The memory of claim 7, wherein the memory further comprises a multi-bit flash memory.

9. The memory of claim 8, wherein the multi-bit flash memory further comprises a multi-level flash memory.

10. The memory of claim 7, wherein the predetermined profile further comprises a predetermined positive slope and a predetermined negative slope.

11. The memory of claim 7, wherein the predetermined profile comprises one or more ramp functions that are executed a predetermined number of times established by the plurality of trim bits during the predetermined profile.

12. The memory of claim 11, wherein the one or more ramp functions comprise one or more of a step, a linear, a log, a sinusoidal, and a parabolic function.

13. A ramp controller for generating a ramped voltage for driving bitlines of a flash memory array during write operations, comprising:
a charge pump configured to supply an unregulated voltage;
a programmable regulator configured receive a program voltage input and to regulate the unregulated voltage to a level based on a value of a trim bit input operable to set a number of times that the ramp voltage is to be subdivided into one or more ramp functions, and to transition the regulated voltage between subsequent levels based on subsequent trim bit inputs according to the one or more ramp functions; and
an output driver circuit connected to the program voltage input and having a ramped voltage output, the output driver configured to provide a variable resistance between the program voltage input and the ramped voltage output, the variable resistance based on the regulated voltage;
wherein a sequence of trim bit inputs provided to the programmable regulator transitions the resistance of the output driver in such a manner that the regulator voltage output transitions according to one of the ramp functions, thereby providing a ramped voltage for driving bitlines of the flash memory array during write operations.

14. The controller of claim 13, wherein the memory further comprises a multi-bit flash memory.

15. The controller of claim 14, wherein the multi-bit flash memory further comprises a multi-level flash memory.

16. The controller of claim 13, wherein the one or more ramp functions comprise one or more of a step, a linear, a log, a sinusoidal, and a parabolic function.

17. A method of generating a ramped voltage for bitlines of a flash memory array during write operations, comprising:
generating the ramped voltage for bitlines from a program voltage based on a plurality of trim bits; and
supplying the ramped voltage to the bitlines of the flash memory array during write operations.

18. The method of claim 17, further comprising:
generating a regulated voltage from a supply voltage;
generating a variable resistance in series with the program voltage based on the regulated voltage; and
generating the ramped voltage for the bitlines based on the variable resistance, the plurality of trim bits, and the program voltage.

19. The memory of claim 18, wherein the memory further comprises a multi-bit multi-level flash memory.

20. The method of claim 17, wherein the ramped voltage comprises a predetermined positive slope and a predetermined negative slope.

21. The method of claim 17, wherein the ramped voltage comprises one or more ramp functions that are executed a predetermined number of times established by the plurality of trim bits.

22. The method of claim 21, wherein the one or more ramp functions comprise one or more of a step, a linear, a log, a sinusoidal, and a parabolic function.

23. An electronic device, comprising:
a user input configured to allow a user to input data;
a user output configured to output data to a user;
a central processing unit (CPU) operatively coupled to the user input and the user output and configured to receive and process the user input and to output the user output; and
a memory operatively coupled to the CPU and configured to receive data from and send data to the CPU, the memory comprising a bitline drive circuit for generating a ramped programming voltage for the bitlines of a multi-bit flash memory array, the bitline drive circuit comprising a program voltage operable to program the bitlines of the array, one or more bitline drivers configured to drive the bitlines of the multi-bit flash memory array, a ramp controller configured to generate a ramped voltage using the program voltage, and to supply the ramped voltage to the one or more bitline drivers, wherein the ramped voltage comprises a predetermined positive slope and a predetermined negative slope.

24. The device of claim 23, wherein the ramp controller, comprises:
a program voltage input, the program voltage operable to program the bitlines of the array;
a trim bit input operable to set a number of times that the ramp voltage is to be subdivided into one or more ramp functions;
a charge pump configured to supply an unregulated voltage;
a programmable regulator configured to regulate the unregulated voltage to a level based on a value of the trim bit input, and to transition the regulated voltage between subsequent levels based on subsequent trim bit inputs according to the ramp functions; and an output driver circuit connected to the program voltage input and having a ramped voltage output, the output driver configured to provide a variable resistance between the program voltage input and the ramped voltage output, the variable resistance based on the regulated voltage;

wherein a sequence of trim bit inputs provided to the programmable regulator transitions the regulator voltage output in such a manner that the resistance of the output driver transitions according to the ramp function, thereby providing a ramped voltage for programming bitlines of the flash memory array.

25. The device of claim 23, the electronic device comprising at least one of a communication device, Personal Data Assistant (PDA), cell phone, memory stick, flash drive device, video camcorder, voice recorder, USB flash drive, fax machine, flash memory, laptop, computer, scanner, MP3 player, digital camera, home video game console, hard drive and memory card.

* * * * *